United States Patent [19]
Babson et al.

[11] Patent Number: 5,847,988
[45] Date of Patent: Dec. 8, 1998

[54] ROM STORAGE CELL AND METHOD OF FABRICATION

[75] Inventors: Gordon M. Babson, Williston; Allen W. Brouillette; Richard J. Evans, both of Underhill; Robert J. Finch, Essex; Philip H. Noel, Richmond; Richard J. Ross, Essex Junction, all of Vt.

[73] Assignee: International Business Machines Corporation, Armonk, N.Y.

[21] Appl. No.: 6,373

[22] Filed: Jan. 13, 1998

Related U.S. Application Data

[62] Division of Ser. No. 855,186, May 13, 1997.

[51] Int. Cl.⁶ ........................................ G11C 17/06
[52] U.S. Cl. ........................ 365/105; 365/175; 438/328
[58] Field of Search ........................... 365/105, 175; 438/328, 419

[56] References Cited

U.S. PATENT DOCUMENTS

| | | | |
|---|---|---|---|
| 3,671,948 | 6/1972 | Cassen et al. | 340/173 SP |
| 3,806,896 | 4/1974 | Mar | 340/173 R |
| 4,099,260 | 7/1978 | Lynes et al. | 365/105 |
| 4,425,379 | 1/1984 | Vora et al. | 427/84 |
| 4,442,507 | 4/1984 | Roesner | 365/100 |
| 4,516,223 | 5/1985 | Erickson | 365/175 |
| 4,569,120 | 2/1986 | Stacy et al. | 29/574 |
| 4,575,743 | 3/1986 | Hashimoto | 357/23.12 |
| 4,598,386 | 7/1986 | Roesner et al. | 365/105 |
| 4,608,672 | 8/1986 | Roberts et al. | 365/230 |
| 4,616,404 | 10/1986 | Wang et al. | 29/576 |
| 4,884,238 | 11/1989 | Lee et al. | 365/105 |
| 5,166,901 | 11/1992 | Shaw et al. | 365/105 |
| 5,200,652 | 4/1993 | Lee | 326/47 |
| 5,257,224 | 10/1993 | Nojiri et al. | 365/175 |
| 5,272,370 | 12/1993 | French | 257/353 |
| 5,313,087 | 5/1994 | Chan et al. | 257/538 |
| 5,379,250 | 1/1995 | Harshfield | 365/105 |

*Primary Examiner*—David C. Nelms
*Assistant Examiner*—Hoai V. Ho
*Attorney, Agent, or Firm*—Eugene I. Shkurko

[57] ABSTRACT

A process and structure are disclosed for a programmable array for use in a read-only memory comprising diode elements and shorted diode elements. The elements are connected across bit and wordlines. The invention utilizes lateral polysilicon diodes and metal silicide layer bridging the junction of pre-selected diodes to short pre-selected diode elements. Programming is accomplished by either forming the silicide layer across the junctions of pre-selected diodes or removing the silicide layer from the junctions of pre-selected diodes.

10 Claims, 6 Drawing Sheets

ROM STORAGE CELL AND METHOD OF FABRICATION

This application is a division of application Ser. No. 08/855,186 filed May 13, 1997.

BACKGROUND OF THE INVENTION

1. Technical Field of the Invention

The present invention relates to the field of semiconductor read-only memories (ROM). More specifically, it relates to a configurable array element for use in a read-only memory array and to a method of fabricating the array element.

2. Background Art

A ROM is a semiconductor device comprising an array of storage elements, or memory cells, and suitable addressing and sensing devices coupled thereto for determining the logic state of each storage element, or selected ones of the storage elements (selected by addressing or sensing means), when reading out data stored in the array. In one type of ROM array, diode elements are used as storage elements. One method of writing the information into the ROM is performed during fabrication of the ROM, sometimes termed mask programming. This type of ROM is capable of being fabricated with a high density of array elements. Typically, it is not possible to write to this type of memory after device fabrication is complete. Traditional uses of ROMs include storing BIOS or BASIC instructions in computers, character patterns for CRT display, or for storing security information.

Trends in semiconductor design are moving toward placing multiple circuit functions on the same die. The use of polysilicon diodes as ROM storage elements is attractive in a CMOS dual polysilicon gate technology because polysilicon diodes can be fabricated without additional process steps and without consuming crystalline silicon real estate.

Turning to the prior art, U.S. Pat. No. 4,516,223 to Erickson describes a lateral polysilicon diode used as a storage element in a mask programmed ROM array. FIG. 1 of the present application shows a schematic representation of the ROM device used in the prior art patent comprising bit lines 10, wordlines 12, and diode elements 14 connected to wordlines 12. Connecting circuit element 16 connects certain diodes to bit lines 10. The diodes are polysilicon and are coextensive with the wordlines, as will be described below. In this ROM device (FIG. 1) the programming of the ROM is done at the masking level used to define the vias, which vias act as the connecting elements 16 shown in FIG. 1. At least two additional levels of fabrication are required to complete the ROM device after this mask level programming step. For cost reasons it would be advantageous to delay this programming step until fabrication of the array is complete, thereby providing an inventory, or allowing stockpiling, of non-programmed devices until they are needed, and reducing part numbers, i.e. specially pre-programmed devices, in the manufacturing line.

The two logic states that must be sensed in this type of array are a diode junction or an open circuit. Using a CMOS inverter as a state sensor, the high state to be detected would be GND+$V_T$ and the low state $V_{DD}$-$V_T$ giving a low-to-high signal margin defined as $V_{DD}$-GND-$2V_T$. Given a first case $V_{DD}$=5v, GND =0v, and $V_T$ =0.7v the signal margin would be 3.6v. However as power supply voltages of modern semiconductor devices decrease, this signal margin will also decrease. Consider the second case: $V_{DD}$ =1.8v, GND=0v, and $V_T$ =0.5v where the signal margin would be 0.8v, Additionally, consider the third case $V_{DD}$=1.3V, GND=0v, and $V_T$ =0.3v where the signal margin would be only 0.4v, Clearly, the trend of lower signal margins presents problems in detecting the logic state of arrays having diode junction and open logic states.

Therefore, there is a need in the industry for a ROM array formed of polysilicon diodes whose fabrication is compatible with CMOS device processing, possessing a high signal margin, and where programming of the ROM may optionally be delayed until post fabrication.

SUMMARY OF THE INVENTION is an object of the present invention to provide a ROM device having a high signal margin. This is provided in the present invention by having the logic states of the array elements to be sensed being either a diode junction or very low resistive element (short) It is a further object of the invention to construct the ROM from lateral PN polysilicon diode elements formed in a manner compatible with dual gate CMOS technology.

Each storage element comprises a polysilicon block having abutting P and N regions forming a PN junction. In storage elements of a first type, a continuous conductive metal silicide layer on top of the polysilicon block extends across the PN junction connecting (shorting) both sides of the diode and also forming contacts (for use by higher level wiring) to the N and P regions. On storage elements of a second type the metal silicide layer on top of the polysilicon block does not extend across the junction, but only forms contacts regions to the N and P regions of the polysilicon block. In both types of cells the contact regions are connected to either bit lines or wordlines. Storage elements of the first type will be sensed as very low resistive (shorted) elements. Storage elements of the second type will be sensed as diode junctions.

In a first embodiment, the storage element of the second type is formed by preventing silicide formation during fabrication. This may be termed mask programming. In a second embodiment, all the storage elements are fabricated identically as elements of the first type and are converted during fabrication or post-fabrication to elements of the second type by removal of silicide from the region over the junction of the diode.

Other features and advantages of this invention will become apparent from the following detailed description of the presently preferred embodiment of the invention, taken in conjunction with the accompanying drawings.

BEST MODE FOR CARRYING OUT THE INVENTION

Figure 1:
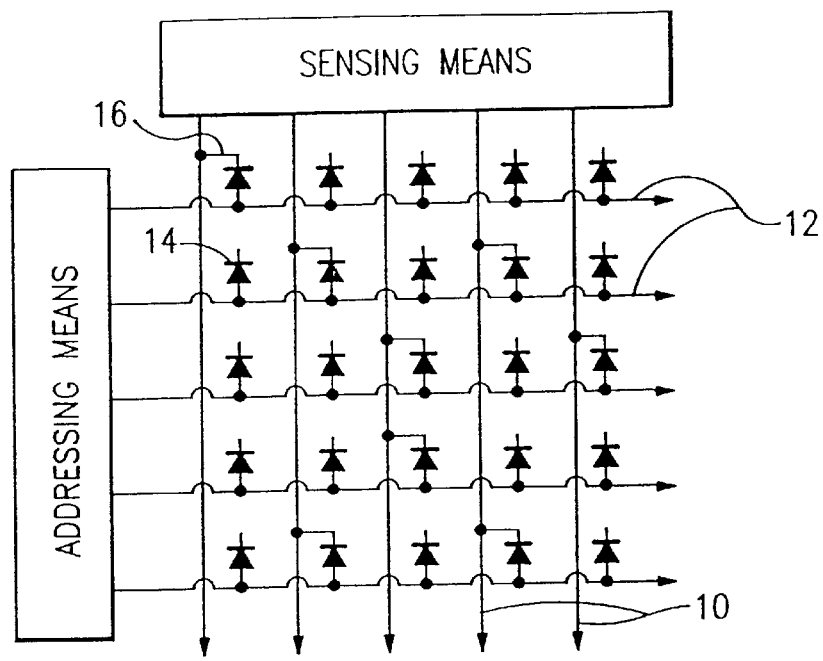
FIG. 1 is a schematic representation of the ROM device of the prior art.
Figure 2:
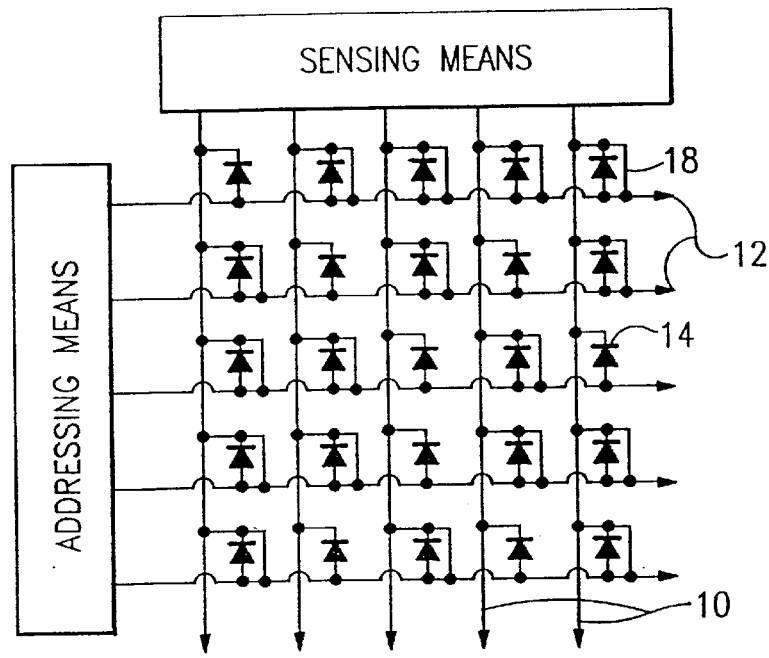
FIG. 2 is a schematic representation of the ROM device of the present invention.

FIG. 2 is a schematic representation of the ROM device described in the present invention comprising bit lines 10, wordlines 12, and diode elements 14 connected between bitlines 10 and wordlines 12. Circuit element 18 is a conductive strap across selected diodes which shorts a bitline 10 to a wordline 12. The addressing means selectively supplies a signal to selected ones, or all, the memory cells. The two logic, or data, states sensed in this array are either a diode junction or very low resistive (short). The array cell states may then be selectively decoded by the sensing means to represent 0 or 1. Thus, the high state to be sensed would be $GND+V_T$ and the low state $V_{DD}$ giving a signal margin defined as $V_{DD-GND-VT}$. This is an improvement of $V_T$ over the prior art ROM device described above in the Background of the Invention. Given these same three cases described above, the signal margin for each of these improvements would be 4.3v, 1.8v and 1v, respectively.

Figure 3:
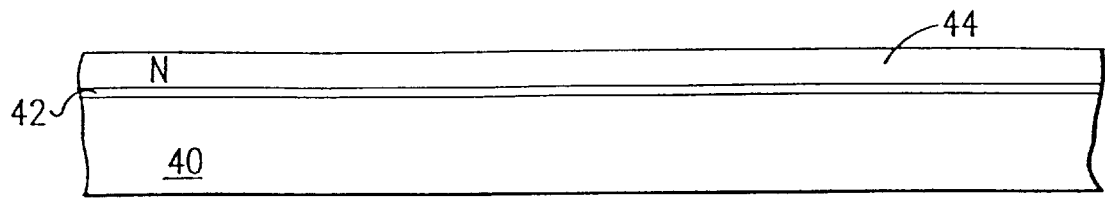
FIG. 3 shows a cross-section of the initial materials layers for fabrication of the present ROM device.

The memory cell elements of the present ROM device are fabricated as follows: In FIG. 3 a silicon substrate 40 has deposited on it a first insulator 42, which may be, for example, a thermal or deposited silicon dioxide. On top of this first insulator a doped polysilicon layer 44 is formed. This may be accomplished by direct deposition of N doped polysilicon or by implantation of the polysilicon with arsenic or phosphorus after deposition of undoped polysilicon.

Figure 4:
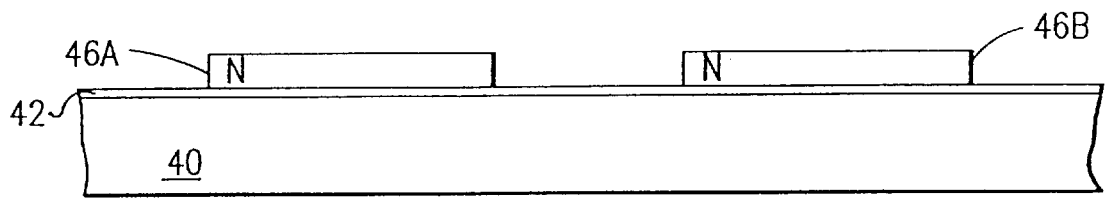
FIG. 4 shows a cross-section through the ROM after patterning of the polysilicon.

FIG. 4 shows the polysilicon layer after it has been masked and etched into the desired regions 46A and 46B by RIE (Reactive Ion Etch) or other suitable means. Regions 46A and 46B will become part of adjacent storage elements of the present inventive apparatus. As will be seen region 46A will become part of a memory cell sensed as a diode junction and region 46B will become part of a very low resistive (shorted) element with a conductive very low resistance strap across the PN junction.

Figure 5:
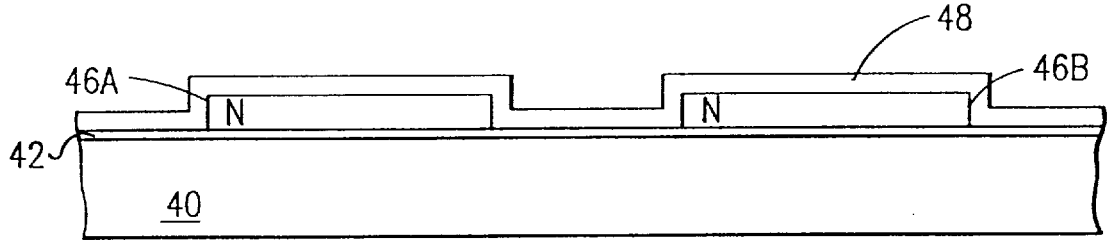
FIG. 5 shows a cross-section through the ROM device after deposition of a conformal insulator layer.
Figure 6:
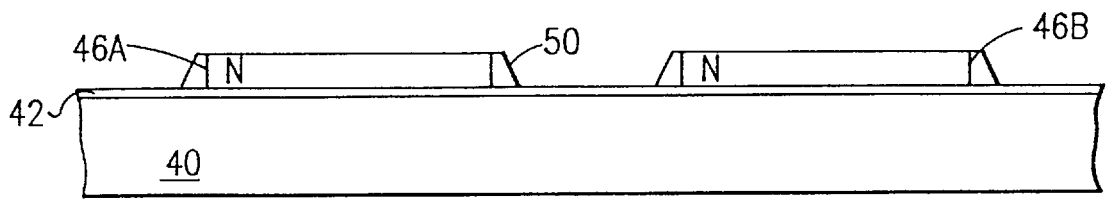
FIG. 6 shows a cross-section through the ROM device after RIE etch of the conformal insulator.
Figure 7:
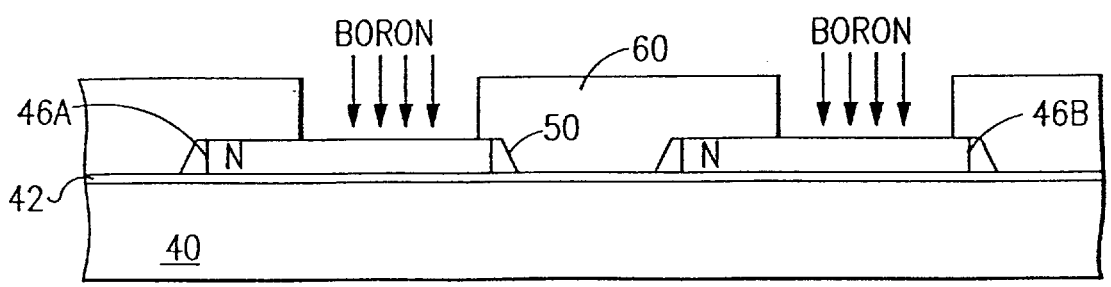
FIG. 7 shows a cross-section through the ROM device during boron implantation.

Referring to FIG. 5, a second insulating layer 48 is formed. In a preferred embodiment, this layer is a conformal material like CVD silicon dioxide or silicon nitride. FIG. 6 shows the resultant sidewall insulation 50 formed after RIE etch of the conformal insulator layer 48. FIG. 7 shows the formation of the p region of the diode elements, i.e. the PN junctions, themselves. A mask layer 60, which may be a photoresist, is used to direct a P type boron implant to regions 46A and 46B. It should be noted that the doping sequence of the diode elements may be reversed, with P type polysilicon being formed first as layer 44 and this implant step then being an N type implant.

Figure 8:
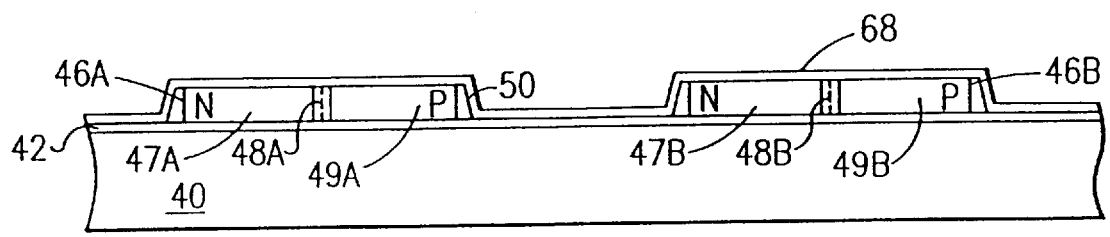
FIG. 8 shows a cross-section through the ROM device after deposition of a silicide forming metal layer.

Referring to FIG. 8, polysilicon region 46A has been formed into an N doped region 47A, a depletion region 48A adjacent the PN junction (the PN junction indicated by a dotted line throughout), and a P doped region 49A. Similarly, polysilicon region 46B has been formed into an N doped region 47B, a depletion region 48B (PN junction shown by dotted lines throughout), and a P doped region 49B. A silicide forming metal 68, such as Ti (preferred), Pt or Ta has been deposited. Silicide formation, described below, is used to lower contact resistance between the deposited metal and the polysilicon underneath. At this point the processing will diverge depending upon which of the three following embodiments of the present invention is chosen.

Figure 9:
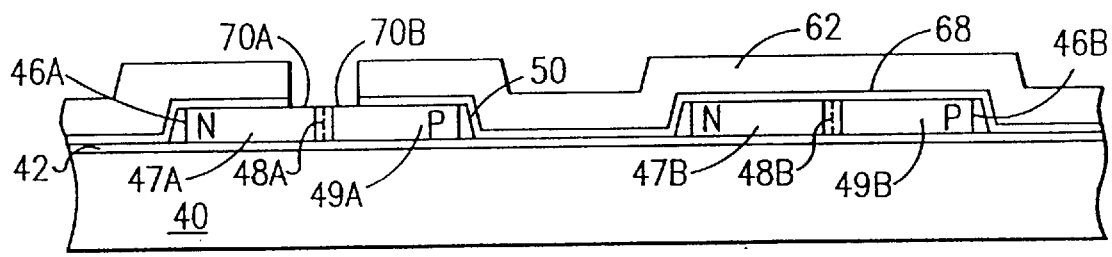
FIG. 9 shows a cross-section through the ROM device after masking and etching of the silicide forming metal layer.
Figure 10:
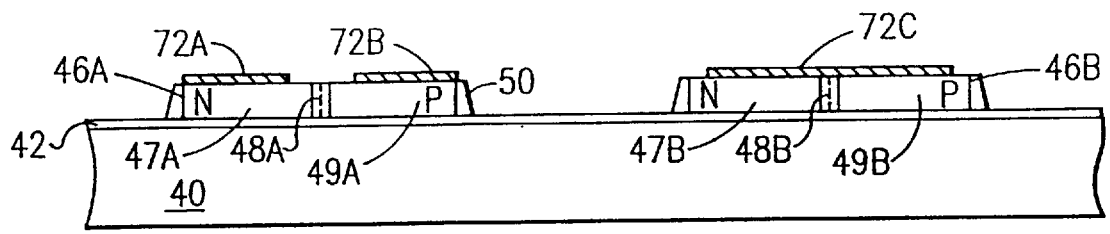
FIG. 10 shows a cross-section through the ROM device after silicide formation.
Figure 11:
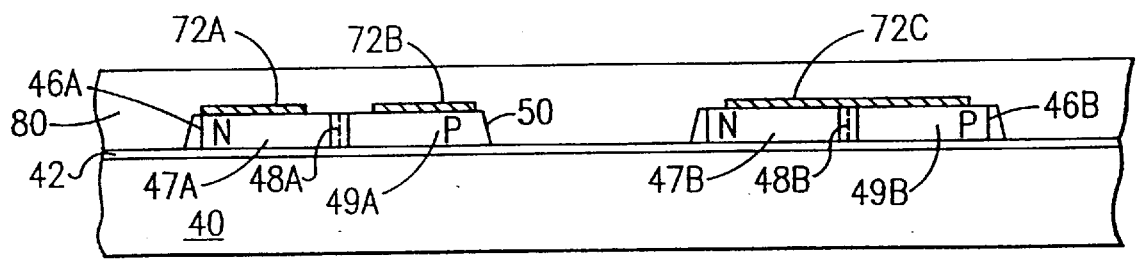
FIG. 11 shows a cross-section through the ROM device after formation of a third insulator layer.
Figure 12:
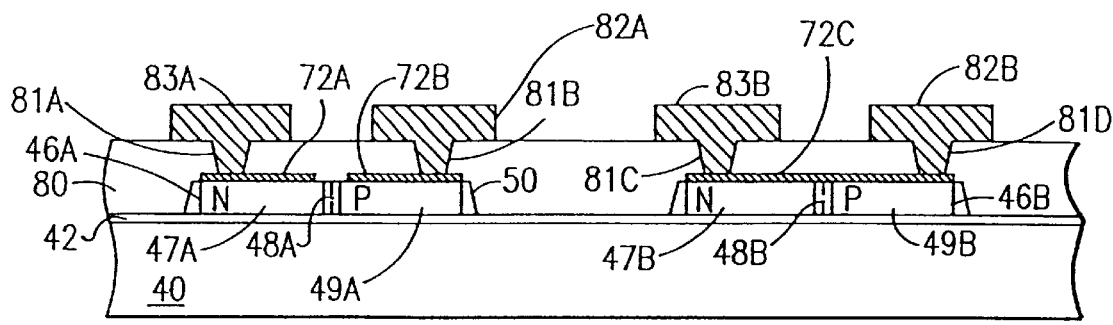
FIG. 12 shows a cross-section through the ROM device.

Referring to FIG. 9, in a first embodiment a mask layer 62, which may be a photoresist, is used to etch the metal over polysilicon regions 70A and 70B well back from both sides of the depletion region 48A. In this embodiment this etching step is the programming step. The mask layer is then removed and the structure exposed to a sintering operation to form a metal silicide by chemical reaction wherever the metal is in contact with polysilicon. Non-reacted metal is etched away. FIG. 10 shows silicide regions 72A, 72B formed over polysilicon regions 47A and 49A, respectively, and silicide region 72C formed over regions 47B, 48B, and 49B. It should be noted that the silicide will form at some distance into the polysilicon (not shown in figures). In FIG. 11 a third insulating layer 80 is deposited through which vias to the contact regions 72A, 72B, and 72C will be etched. FIG. 12 shows vias 81A, 81B, 81C, and 81D have been etched in insulator 80. Metal bit line contacts 82A and 82B have been formed into vias 81B and 81D, and metal wordlines 83A and 83B have been formed into vias 81A and 81C.

Figure 13:
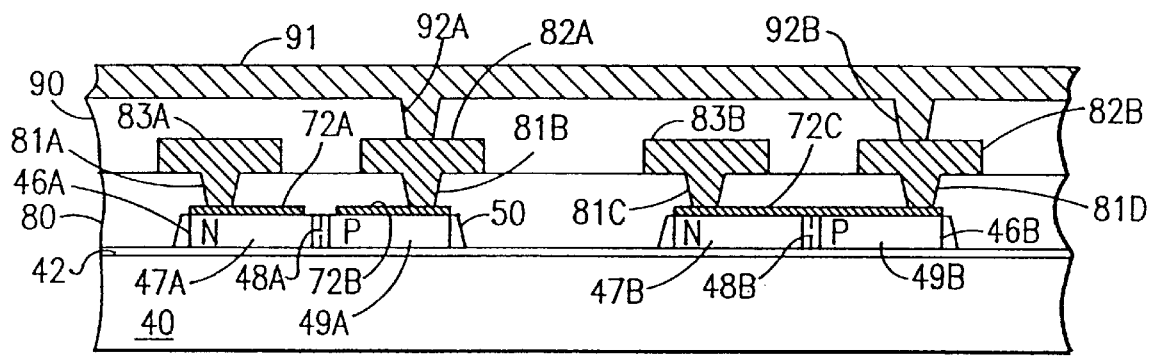
FIG. 13 shows a cross section through the ROM device in a first embodiment.

FIG. 13 illustrates a deposited insulator layer 90 and bitline 91 formed over and through the insulator layer 90, and connected to bit line contacts 82A and 82B. A decoding or sensing circuit coupled to wordline 83A and bitline 91 will detect a diode junction when the memory cell on the left of FIG. 13 is sensed, while a decoding circuit coupled to wordline 83B and bitline 91 will detect a short when the memory cell on the right of FIG. 13 is sensed.

Figure 14:
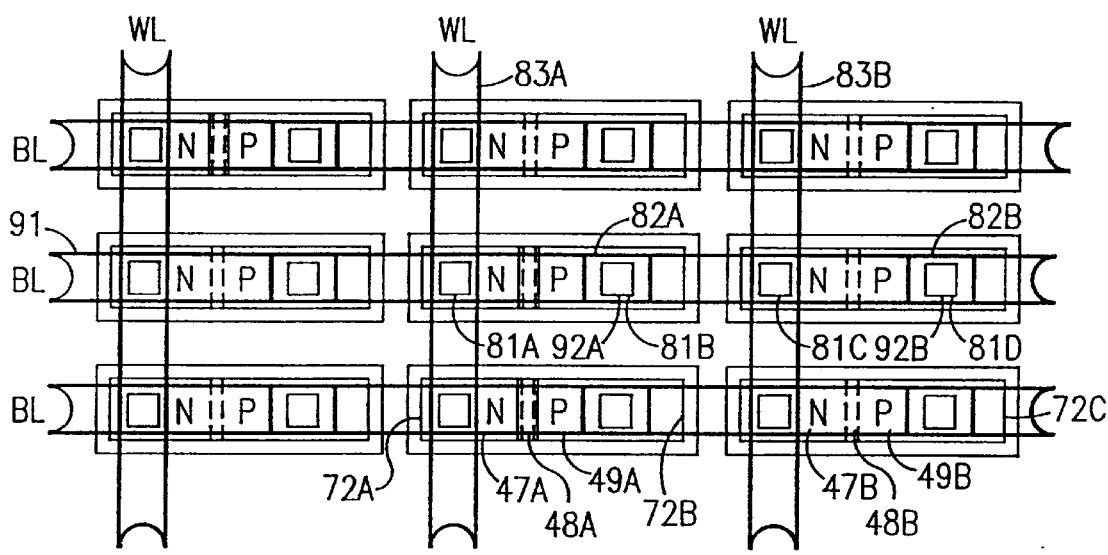
FIG. 14 is a top view of a portion the ROM device in the first embodiment.

FIG. 14 illustrates a top view of the ROM device of FIG. 13. Sub-surface dimensions in this figure are not necessarily shown by dotted lines. The depletion regions are shown by dotted lines. The solid lines parallel and immediately outside the depletion regions in several of the memory cells indicate a non-shorted memory cell. The memory cells formed in this way are sensed, or read, by the sensing or decoding means when an addressing, or reading, means applies a voltage (signal) to selected ones of the memory cells via corresponding word and bitlines. The diode junction or very low resistance (short) is then detected by the decoding or sensing means (shown in FIG. 2). The addressing or reading means and the decoding or sensing means are conventional in the art, and are not described further.

Figure 15:
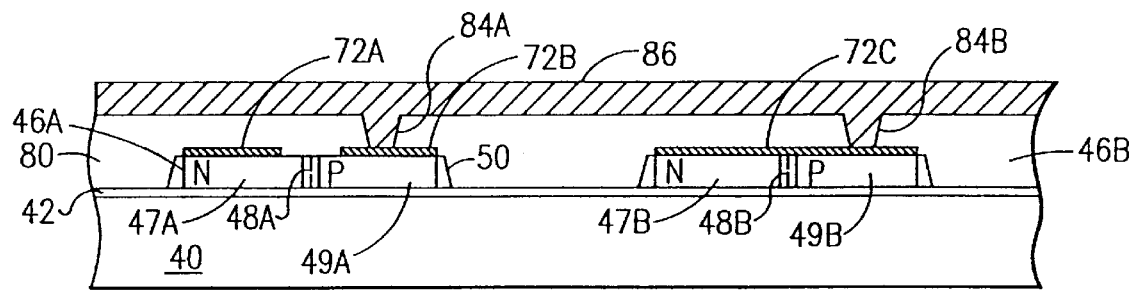
FIG. 15 shows a cross section through the ROM device in a second embodiment.
Figure 16:
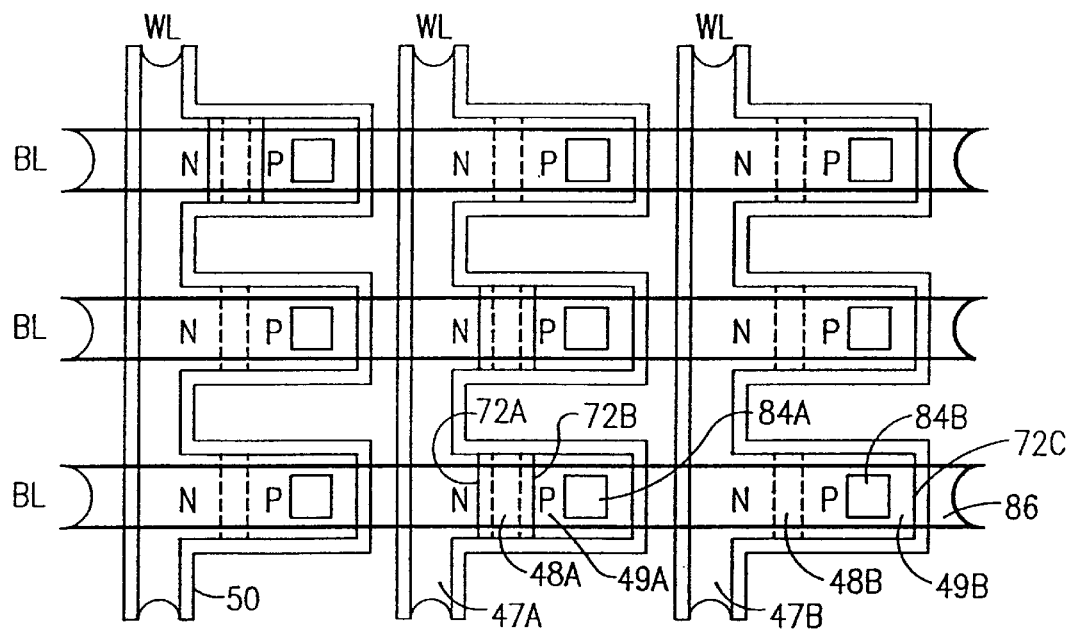
FIG. 16 is a top view of a portion of the ROM device in the second embodiment.

Referring to FIG. 15, in a second embodiment the wordlines 47A are composed of polysilicon, are co-extensive and coplanar with the N doped polysilicon regions 47A and 47B. The bitlines 86 are metal. FIG. 15 shows a cross-section and FIG. 16 a top view of this second embodiment. Wordlines (not numbered) are composed of polysilicon and are co-extensive with the N doped polysilicon regions 47A and 47B. The bit line 86 contacts silicide regions 72B and 72C through vias 84A and 84B, respectively. In FIG. 16 the bit lines 86 are bordered with bold horizontal lines. The depletion region 48A is shown as a dotted line and the solid lines parallel thereto indicate a nonshorted PN junction. A decoding circuit (or sensing means) coupled to word line 47A and bit line 86 will detect a diode junction during decoding or sensing, while a decoding circuit coupled to word line 47B and bit line 86 will detect a short during decoding or sensing.

Figure 17:
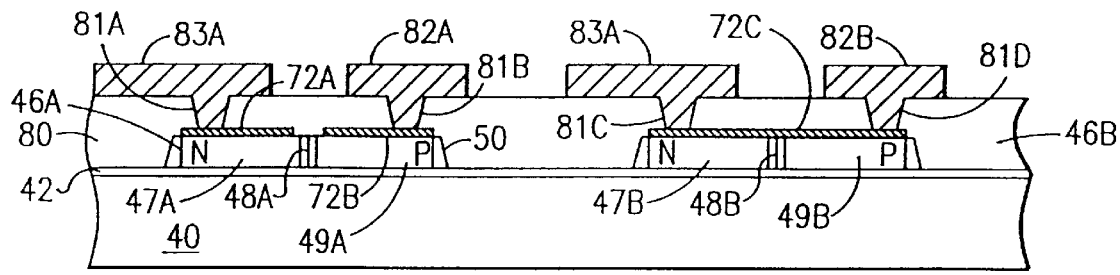
FIG. 17 shows a cross-section along section line AA of FIG. 19 of two storage elements of the ROM device after formation of a first wiring layer.
Figure 18:
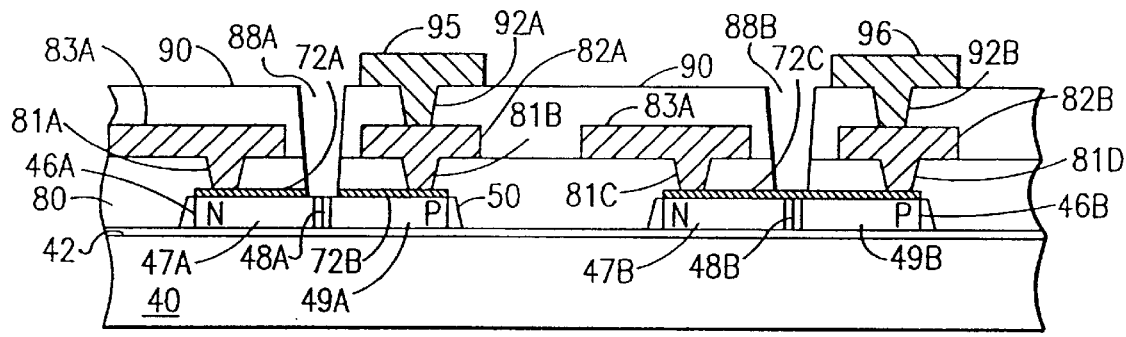
FIG. 18 shows a cross-section along section line AA of FIG. 19 of two storage elements of the ROM device after formation of a second wiring layer.
Figure 19:
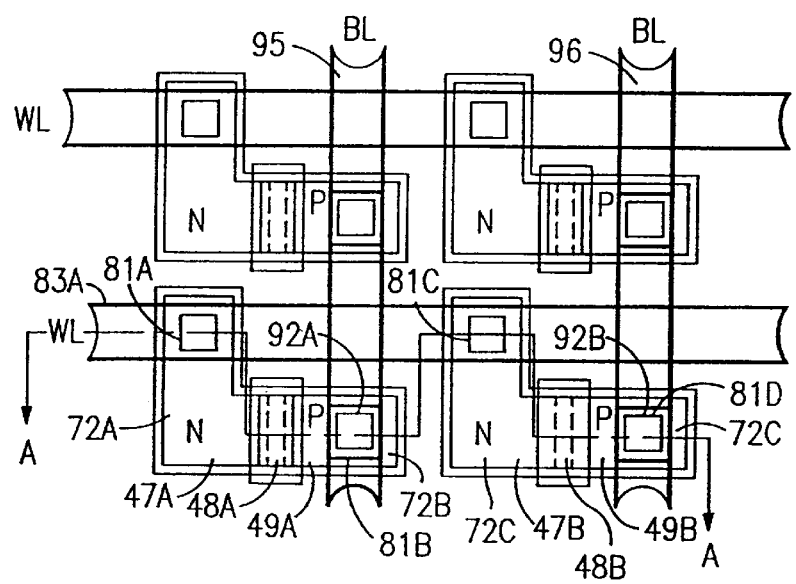
FIG. 19 is a top view of a portion of the ROM device in FIG. 18.

Referring to FIGS. 18 and 19, in a third embodiment the mask programming step shown in FIG. 9 is not performed. Note in FIG. 19 the word lines are shown horizontally and the bit lines vertically. The processing sequence would be instead as follows: after sintering, silicide will form (react) on the metal/polysilicon junctions. After etching away non-reacted metal both of the storage elements will be identical. The silicide so formed will extend across the junction regions effectively shorting the diodes in both example memory cells. A third insulator is formed and vias for bit line and word line contacts etched. Bit line contacts and word-lines are formed as shown in FIG. 17. In FIG. 18, a fourth insulator 90 is deposited, vias to the bit line contacts and windows over the junction regions 48A and 48B are formed and bit line metallurgy provided. The devices may be stockpiled at this point for a programming step to be performed later. To program the ROM devices the silicide is removed from selected ones of the windows. This may be done chemically, by ion beam milling, or laser ablation. FIG. 18 is a cross-section and FIG. 19 a top view of this third embodiment. In FIG. 17 vias 81A, 81B, 81C and 81D are formed in insulator 80. Metal bit line 83A has been formed to contact silicide regions 72A and 72C. Metal bit line contacts 82A and 82B have been formed to contact silicide regions 72B and 72C. In FIG. 18 bit line 95 has been formed over insulator 90 contacting bit line contacts 82A through via 92A and bit line 96 has been formed over insulator 90 contacting bit line contact 82B through via 92B. Windows 88A and 88B have been formed through insulators 80 and 90. The silicide has been removed in window 88A but not from window 88B (72C forms a short). A decoding circuit coupled to bit line 95 and word line 83A will detect a diode junction when sensed, while a decoding circuit coupled to bit line 96 and word line 83A will detect a very low resistance (short).

It should be understood that in all cases the N and P regions may be swapped as well as the designations of certain lines as bit lines and others as word lines.

The description of the embodiments of the present invention is given above for the understanding of the present invention. It will be understood that the invention is not to the particular embodiments described herein, but is capable of various modifications, rearrangements and substitutions without departing from the scope of the invention. Therefore, it is intended that the following claims cover all such modifications and changes as fall within the true spirit and scope of the invention.

What is claimed is:

1. A method comprising the steps of:

forming a first insulating layer on a substrate;

forming a polysilicon layer on said first insulating layer;

patterning and etching said polysilicon layer into a plurality of polysilicon blocks;

doping a first region of each said polysilicon blocks with a first dopant type and doping a second abutting region of each said polysilicon blocks with a second dopant type whereby a junction region is formed;

depositing a layer of silicide forming metal;

removing said silicide forming metal from a predetermined area over preselected junction regions;

sintering to form a metallic silicide including removing unreacted portions of the silicide forming metal; and forming a first conductive line connecting selected first regions of said polysilicon blocks and a second conductive line connecting selected second regions of said polysilicon blocks.

2. The method of claim 1, further comprising the step of forming a sidewall insulation on said polysilicon blocks.

3. The method of claim 1, wherein said first conductive line comprises polysilicon and is co-extensive with first doped regions of said polysilicon blocks.

4. The method of claim 1 wherein said silicide forming metal is selected from the group consisting of titanium, platinum, and tantalum.

5. A method comprising the steps of:

forming a first insulating layer on a substrate;

forming a polysilicon layer on said first insulating layer;

patterning and etching said polysilicon layer into a plurality of polysilicon blocks;

doping a first region of each said polysilicon blocks with a first dopant type and doping a second abutting region of each said polysilicon blocks with a second dopant type whereby a junction region is formed;

depositing a layer of silicide forming metal;

sintering to form a metallic silicide including removing unreacted portions of the silicide forming metal; and forming a first conductive line connecting selected first regions of said polysilicon blocks and a second conductive line connecting selected second regions of said polysilicon blocks.

6. The method of claim 5 further comprising the step of removing said silicide from a predetermined area over preselected junction regions.

7. The method of claim 5, further comprising the step of forming a sidewall insulation on said polysilicon blocks.

8. The method of claim 5, wherein said first conductive line comprises polysilicon and is co-extensive with said selected first regions of said polysilicon blocks.

9. The method of claim 5 wherein said silicide forming metal is selected from the group consisting of titanium, platinum, and tantalum.

10. The method of claim 5, wherein the step of removing said silicide is selected from the group consisting of etching, ion milling and laser ablation.

\* \* \* \* \*